US008247057B2

(12) United States Patent
Velasquez Urey et al.

(10) Patent No.: US 8,247,057 B2
(45) Date of Patent: Aug. 21, 2012

(54) COVER TAPE AND METHOD FOR MANUFACTURE

(75) Inventors: Ruben E. Velasquez Urey, Austin, TX (US); Rocky D. Edwards, Lago Vista, TX (US); Laura C. Devaney, Austin, TX (US); David J. VanOverbeke, Hutchinson, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 476 days.

(21) Appl. No.: 11/463,569

(22) Filed: Aug. 9, 2006

(65) Prior Publication Data

US 2007/0062845 A1 Mar. 22, 2007

Related U.S. Application Data

(63) Continuation-in-part of application No. 11/228,956, filed on Sep. 16, 2005, now abandoned.

(51) Int. Cl.
*B65D 65/28* (2006.01)
*B32B 7/12* (2006.01)

(52) U.S. Cl. .......... 428/43; 428/343; 428/131; 428/132; 428/133; 428/134; 428/135; 428/136; 428/137; 428/138; 428/139; 428/140

(58) Field of Classification Search ........................ None
See application file for complete search history.

(56) References Cited

U.S. PATENT DOCUMENTS

| | | | |
|---|---|---|---|
| 3,467,250 A | 9/1969 | D'Elia et al. | |
| 3,717,244 A * | 2/1973 | Smith | 206/484 |
| 4,584,220 A | 4/1986 | Melbye | |
| 4,944,979 A * | 7/1990 | Gagliano et al. | 428/43 |
| 5,006,856 A | 4/1991 | Benge et al. | |
| 5,027,465 A | 7/1991 | McKay | |
| 5,080,233 A * | 1/1992 | Wyberg | 229/214 |
| 5,208,103 A | 5/1993 | Miyamoto et al. | |
| 5,229,180 A * | 7/1993 | Littmann | 428/43 |
| 5,325,654 A | 7/1994 | Juntunen et al. | |
| 5,346,765 A | 9/1994 | Maeda et al. | |
| 5,390,472 A | 2/1995 | Weiler et al. | |
| 5,691,038 A | 11/1997 | Hirata et al. | |
| 6,027,802 A | 2/2000 | Lin | |
| 6,383,567 B2 | 5/2002 | Ager et al. | |
| 2003/0049437 A1 | 3/2003 | Devaney et al. | |
| 2004/0163482 A1 | 8/2004 | Yamamoto et al. | |
| 2004/0165944 A1* | 8/2004 | Varanese et al. | 403/266 |
| 2009/0038501 A1* | 2/2009 | Hirai | 105/61 |
| 2009/0145543 A1* | 6/2009 | Velasquez Urey et al. | 156/252 |

FOREIGN PATENT DOCUMENTS

| | | |
|---|---|---|
| CN | 1224687 | 8/1999 |
| EP | 0 300 838 | 1/1989 |
| EP | 0 925 715 B1 | 8/2000 |
| JP | 04-201871 | 7/1992 |
| JP | 04311464 | 11/1992 |
| JP | 05-213364 | 8/1993 |
| JP | HEI 5-310264 | 11/1993 |
| JP | HEI 11-222581 | 8/1999 |
| JP | 2003-332392 | 11/2003 |
| WO | WO 95/21519 | 8/1995 |
| WO | WO 02/085584 | 10/2002 |
| WO | WO2009006393 A2 * | 1/2009 |

* cited by examiner

*Primary Examiner* — Alicia Chevalier
*Assistant Examiner* — Anish Desai
(74) *Attorney, Agent, or Firm* — Robert S. Moshrefzadeh

(57) ABSTRACT

An article includes a cover tape, which includes a base film layer, tear enabling features, and an adhesive. The base film layer has opposed longitudinal edges and top and bottom surfaces. The tear enabling features are substantially parallel to the longitudinal edges and at the top and bottom surfaces.

14 Claims, 3 Drawing Sheets

COVER TAPE AND METHOD FOR MANUFACTURE

This application is a continuation-in-part of U.S. patent application Ser. No. 11/228,956, filed Sep. 16, 2005, now abandoned which is incorporated by reference.

FIELD

The present invention relates to tapes for carrying components.

BACKGROUND

In manufacturing settings, it is often necessary to hold and transport components. For example, in the field of electronics circuit assembly, electronic components are often carried from a supply of components to a specific location on a circuit board for attachment thereto. The components may be of several different types, including surface mount components. Particular examples include memory chips, integrated circuit chips, resistors, connectors, processors, capacitors, gate arrays, etc. It is possible to transport small and delicate components using a carrier tape/cover tape system, such as that disclosed in U.S. Pat. No. 5,325,654.

The electronic industry is continually moving towards smaller devices and thus smaller components, which in turn require more delicate and precise removal of such components from the carrier tape/cover tape system. Most known cover tapes use heat activated adhesive (HAA) or pressure sensitive adhesive (PSA) to bond the cover tape to the carrier tape. Removal of the components is done by first carefully peeling or debonding the cover tape off of the carrier tape to expose the component to vacuum nozzles or other component handling equipment for safe component removal.

However, known cover tapes present several operational difficulties. For instance, peeling the cover tape from the carrier tape can create "shocky", rough, nonuniform and inconsistent peels, which cause movement of the carrier tape/cover tape that can displace the small components. Shocky peels have also been known to eject the small components out of the pocket in the carrier tape, thus causing miss-picks and eventual shut down of automated component handling equipment.

The peel force of adhesive cover tape can vary considerably depending on the width of the cover tape and the type of carrier tape used. Wider HAA cover tapes require higher heat to get secure bonds. Likewise, wider PSA cover tapes have lower peel forces and require wider adhesive exposure to get secure bonds. In addition, cover tapes that are designed for one type of carrier tape (e.g., polystyrene) do not always have good performance on other types of carrier material (e.g., polycarbonate). Even if cover tapes do nominally work with different types of carrier tapes, they may have less than optimum peel force and nonuniform peels. Moreover, HAA cover tapes also have poor stability as the peel force degrades with time and temperature.

BRIEF SUMMARY

Aspects of the present invention provide a cover tape that works well with a myriad of carrier tapes because the peel forces are not a major factor in removing the cover tape from the carrier tape.

In one aspect of the present invention, an article includes a cover tape comprising a base film layer having opposed longitudinal edges and upper and lower surfaces; an adhesive adjacent to the longitudinal edges; and tear enabling features at the upper and lower surfaces of the base film layer substantially parallel to the longitudinal edges and interior to the adhesive.

In another aspect of the present invention, a method of making a cover tape includes providing a base film layer having opposed longitudinal edges and upper and lower surfaces; forming tear enabling features at the upper and lower surfaces of the base film layer substantially parallel to the longitudinal edges; and applying an adhesive adjacent to the longitudinal edges and exterior to the tear enabling features.

The above summary is not intended to describe each disclosed embodiment or every implementation of the present invention. The figures and the detailed description, which follow, more particularly exemplify illustrative embodiments.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale. Like reference numbers have been used throughout the figures to denote like parts.

DETAILED DESCRIPTION

Aspects of the present invention relate to a cover tape, a carrier tape/cover tape system, as well as to a method for making a cover tape. A cover tape according to the present invention can be adhered to a carrier tape, which can hold components for storage and transportation. The cover tape can cover pockets in the carrier tape that can hold components, and has a portion that can be separated from the system to expose the pockets in the carrier tape. Tear enabling features on the cover tape permit the portion of the cover tape to be separated from other portions of the cover tape (and a carrier tape to which the cover tape was adhered) with a substantially consistent and uniform separation force, which reduces the possibility of undesired movement of components held by the carrier tape during the separation process. As used herein, the term "tear" means generally controlled separation of portions of a tape. In addition, embodiments of the cover tape according to the present invention can have optional recesses along the longitudinal edges of the cover tape, which help the cover tape maintain a relatively flat profile during storage and application. The location of the adhesive is typically spaced from the edge of the cover tape, which helps prevent contamination of the adhesive and undesired adhesion of the adhesive to other surfaces, such as cover tape handling equipment.

Figure 1:
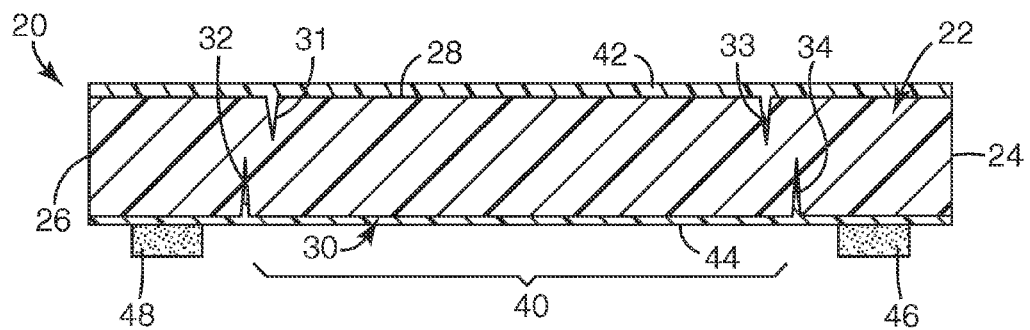
FIG. 1 is a cross-sectional schematic view of a cover tape according to the present invention.

FIG. 1 is a cross-sectional schematic view of a cover tape 20 suitable for use in a carrier tape/cover tape system. The cover tape 20 includes an elongate film 22 that has opposed longitudinal edges 24 and 26, and opposed top and bottom faces 28 and 30, respectively. The film 22 can be a polymer film, for example, polyethylene terephthalate, oriented polypropylene (e.g., biaxially oriented polypropylene), oriented polyamides, oriented polyvinyl chloride, polystyrene, polycarbonate, polyethylene, polyacrylonitrile, polyolefin and polyimide films. The film 22 can be transparent. Additionally, the film 22 can be intrinsically electrically conductive or static dissipative.

Figure 3:
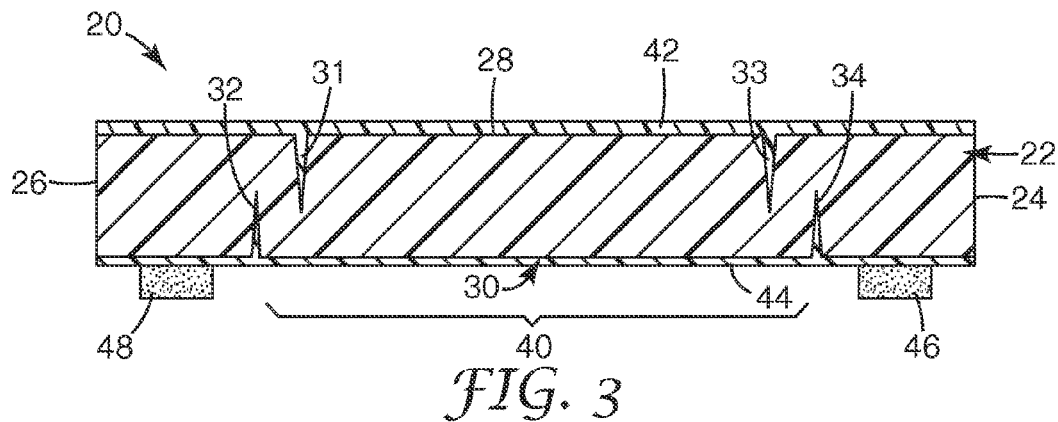
FIG. 3 is a cross-sectional schematic view of another embodiment of a cover tape according to the present invention.

Longitudinally extending tear enabling features 31 and 33, and 32 and 34, are located relative to the top face 28, and bottom face 30, respectively, of film 22. The tear enabling feature sets 31/32 and 33/34 are spaced apart from each other, and a central portion 40 of the film 22 is defined therebetween. Tear enabling features 32 and 34 can be located nearly anywhere along the bottom face 30, and tear enabling features 31 and 33 can be located nearly anywhere along the top face 28, so long as they are each spaced from the longitudinal edges 24 and 26 of the film 22. The upper tear enabling features 31 and 33 may be interior to lower tear enabling features 32 and 34, as shown in FIG. 1, or may be exterior to the lower tear enabling features. The upper and lower tear enabling features may not overlap, i.e., extend beyond each other, in the interior of film 22, as shown in FIG. 1, or they may overlap, as shown in FIG. 3. The upper and lower tear enabling features may or may not be the same length. One may be shorter than the other, for example, as shown in FIG. 1, the lower tear enabling features 32 and 34 are longer than the upper tear enabling features 31 and 33. As shown in FIG. 1, the tear enabling features 31, 32, 33, and 34 are continuous score lines that extend longitudinally along film 22. Such score lines can be formed by cutting into the film 22 (e.g., with lasers, die cutters, and blades). Alternatively, the tear enabling features 31, 32, 33, and 34 can be weakened regions of the film 22 (e.g., interfaces of different materials, thinner regions, perforations, etc.).

A top coating 42 is optionally provided along top face 28 of film 22. The top coating 42 can include a static dissipative (SD) coating, LAB (i.e., an adhesive release coating), an anti-reflective or glare-reducing coating, and other coatings and combinations of coatings. A bottom coating 44 is also optionally provided along the bottom face 30 of the film 22, which can be a SD coating or other type of coating and can be at least partially blended with the film 22. Longitudinally disposed adhesive stripes 46 and 48 are provided on outer edges of bottom face 30. The adhesive stripes 46 and 48 can be, for instance, pressure sensitive adhesives (PSAs), heat activated, or microencapsulated adhesives.

Figure 2:
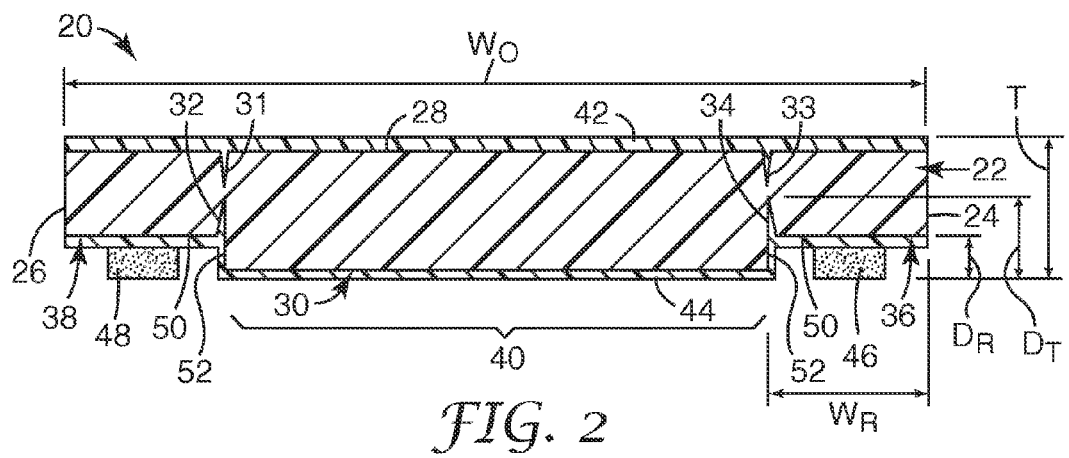
FIG. 2 is a cross-sectional schematic view of another embodiment of a cover tape according to the present invention.

The embodiment shown in FIG. 2 has optional recesses 36 and 38. Recesses 36 and 38 are located at the longitudinal edges 24 and 26, respectively, of the film 22. The recesses 36 and 38 are each open facing the bottom face 30 and longitudinal edges 24 and 26, respectively, of the film 22. A bottom portion 50 and a side portion 52 define each of the recesses 36 and 38. The adhesive stripes 46 and 48 can be disposed on the bottom portions 50 of the recesses 36 and 38, respectively. The bottom portions 50 of the recesses 36 and 38 can have microtexture (not shown in FIG. 1) for better adhering the adhesive stripes 46 and 48 to the film 22. It should be recognized that other recess shapes can be utilized, so long as the recesses 36 and 38 are open facing an adjacent elongate edge 24 or 26 of the film 22 and the bottom face 30 of the film 22. The film 22 with recesses 36 and 38, can be formed, for example, using processes such as scoring, extrusion, calendaring, micro-replication, laser ablation, ultrasound, die cutting, chemical etching, and stripping.

The tear enabling features 31 and 33, and 32 and 34, are located relative to the top face 28, and the bottom face 30, respectively, of the film 22, and can be located adjacent the recesses 36 and 38 at the side portions 52 thereof.

In one embodiment, provided by way of example and not limitation, the cover tape 20 can have the following dimensions. An overall width $W_O$ of the film 22 (measured between elongate edges 24 and 26) is about 1 inch (2.54 cm). A thickness T of the film 22 is about 2 mil (0.0254 mm) (measured at the thickest portion of the central region 40 of the film 22). The recesses 36 and 38 each have a width $W_R$ of about 0.0393701 inch (1 mm) and a depth $D_R$ of about 0.5 mil (0.0127 mm). The tear enabling features 32 and 34 are score lines each having a depth $D_T$ of about 1.5 mil (0.0381 mm) (measured from the bottom face 30 of the film 22). Tear enabling features 31 and 33 are located directly above tear enabling features 32 and 34, respectively, and have depths less than 1.5 mil. It should be recognized that dimensions of the cover tape 20 can vary, as desired. For instance, a width of the central portion 40 of the film 22 can be selected such that it is at least as wide as the pockets of a carrier tape with which the cover tape 20 is used.

FIG. 3 is a cross-sectional schematic view of a further embodiment of a cover tape 20. The upper tear enabling features 31 and 33 are interior to lower tear enabling features 32 and 34. The upper and lower tear enabling features overlap, i.e., extend beyond each other, in the interior of film 22. The upper tear enabling features 31, 33 are longer than the lower tear enabling features 32, 34.

Figure 4:
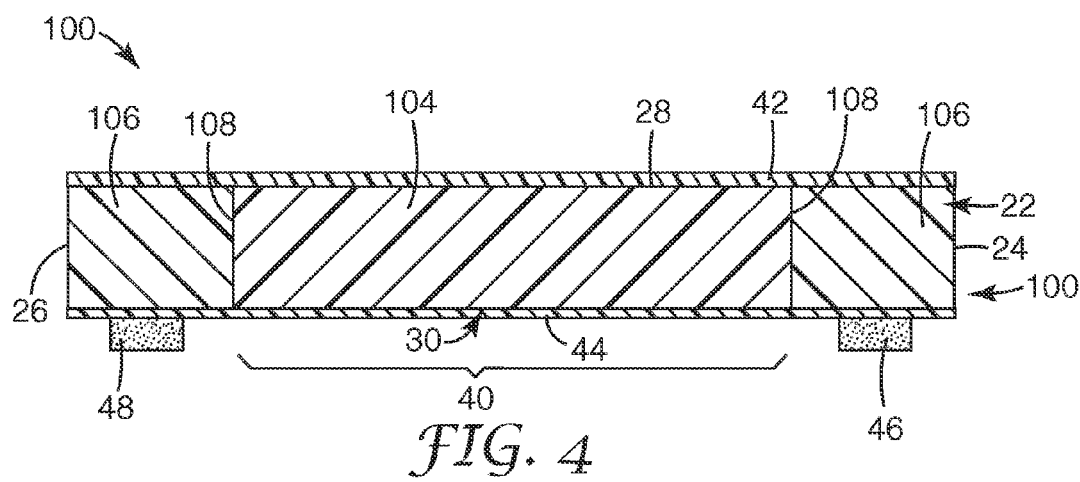
FIG. 4 is a cross-sectional schematic view of another embodiment of a cover tape according to the present invention.

FIG. 4 is a cross-sectional schematic view of a further embodiment of a cover tape 100. The cover tape 100 is generally similar to cover tape 20; however, the film 22 includes a first material 104 and a second material 106. With cover tape 100, the second material 106 extends from elongate edges 24 or 26 to material interfaces 108. The central portion 40 of the film 22 is defined between material interfaces 108. The material interfaces 108 exhibit weaker bonding or connection strength than internal bonding or cohesion of either the first material 104 or the second material 106. The relative weakness of the material interfaces 108 facilitates substantially consistent and uniform tearing, that is, the separation of the first material 104 and the second material 106 at the material interfaces 108. Thus, the material interfaces 108 can form tear enabling features. A single tear enabling feature formed by material interface 108 is similar to a set of upper and lower tear enabling features, e.g., 31 and 32, in other embodiments of the present invention. In both instances there are tear enabling feature at the upper and lower surfaces of film 22.

The first and second materials 104 and 106 can generally be selected from the same types of materials discussed with respect to FIGS. 1 and 2 above. In some embodiments the first material 104 can be weaker than the second material 106, or vice versa. In other words, one material can have weaker internal cohesive or bonding properties than the other. Moreover, the central portion 40 of the film 22 can be transparent and have high optical clarity while the outer portions of the tape need not be.

The films 22 of cover tapes 100 can be fabricated using processes such as co-extrusion and profile extrusion. With co-extrusion, the first and second materials 104 and 106 are extruded together in a desired arrangement. With profile extrusion, the first and second materials 104 and 106 are extruded individually in desired shapes and are joined while still molten after the initial individual extrusion process. Fabrication may result is some negligible intermingling of the first and second materials 104 and 106 at their interface (e.g., at interface 108 in FIG. 4). In this embodiment, the tear enabling features do not require scoring.

Figure 5:
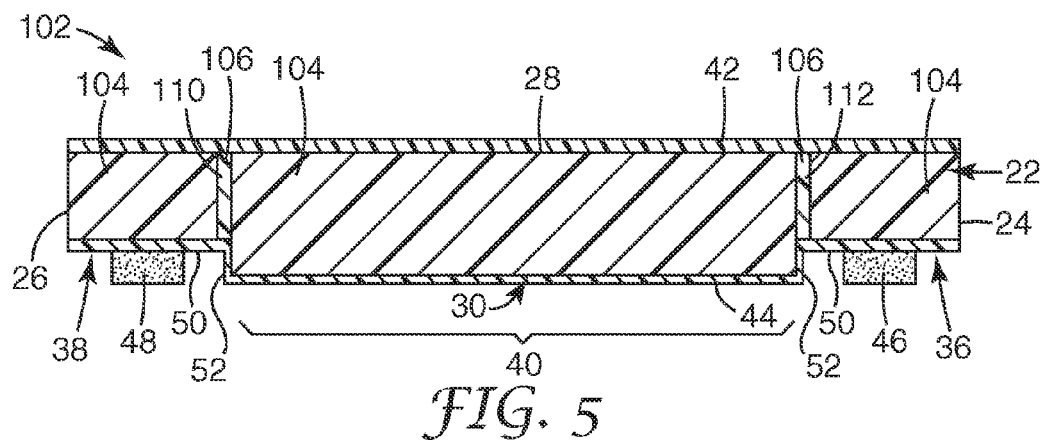
FIG. 5 is a cross-sectional schematic view of another embodiment of a cover tape according to the present invention.

FIG. 5 is a cross-sectional schematic view of another embodiment of a cover tape 102. The cover tape 102 is generally similar to cover tape 100 and has optional recesses 36 and 38. The film 22 includes a first material 104 and a second material 106. With cover tape 102, the second material 106 is disposed in elongate bands 110 and 112 positioned near side portions 52 of the recesses 36 and 38, with the first material 104 disposed on either side of bands 110 and 112 of the second material 106. The central portion 40 of the film 22 is defined between the bands 110 and 112 of the second material 106.

The second material 106 is generally weaker than the first material 104. In other words, the second material 106 has weaker internal cohesive or bonding properties than does the first material 104. This facilitates consistent and uniform tearing of the film 22 within the bands 110 and 112 of the second material 106. The bands 110 and 112 thus constitute tear enabling features. A single tear enabling feature formed by band 110 or 112 is similar to a set of upper and lower tear enabling features, e.g., 31 and 32 or 33 and 34, in other embodiments of the present invention. In both instances there are tear enabling feature at the upper and lower surfaces of film 22. In some embodiments, the first material 104 can resist tearing. The second material 106 can comprise a different and weaker form of the type of material as the first material 104, or can be an entirely different type of material. The first and second materials can generally be selected from the same types of materials discussed with respect to FIGS. 1-2 above. In addition, the weaker second material 106 can be made of ethylene vinyl acetate (EVA). In this embodiment, the tear enabling features do not require scoring.

Cover tape can be placed in a roll after it has been fabricated and prior to being adhered to a carrier tape. Placing the cover tape in a roll facilitates storage and transportation, as well as automated handling of the cover tape. Coating materials on the top face of the cover tape can facilitate peeling portions of the cover tape away from the roll.

Figure 6:
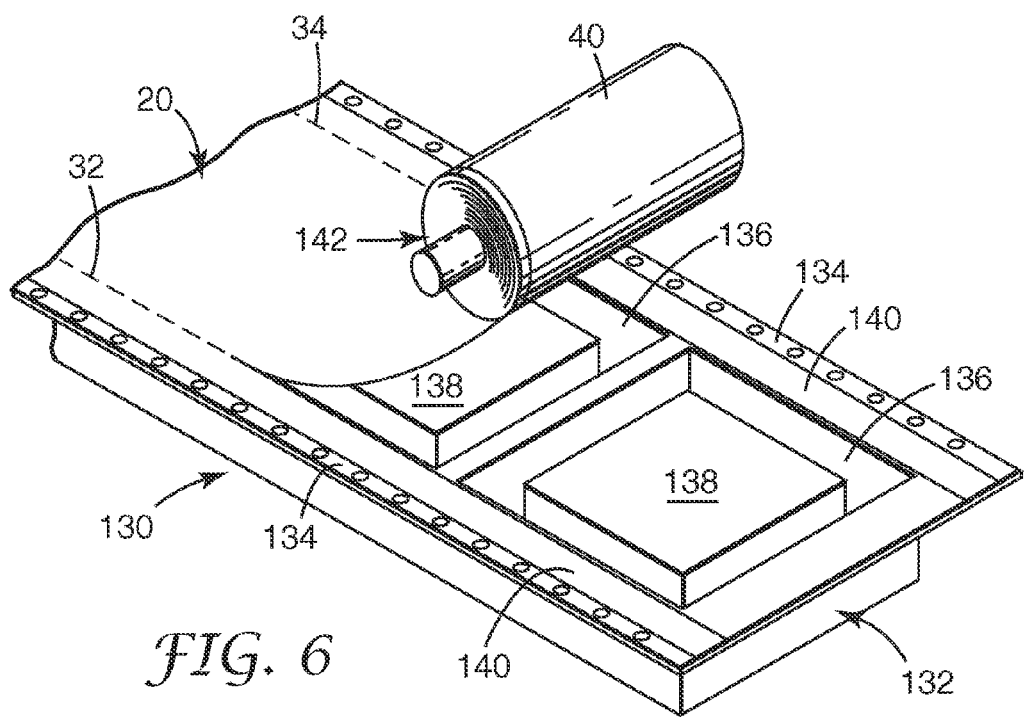
FIG. 6 is a perspective view of a carrier tape/cover tape system according to the present invention, showing separation of the cover tape therefrom.

Cover tape can be used in a carrier tape/cover tape system. FIG. 6 is a perspective view of a carrier tape/cover tape system 130 that includes a carrier tape 132 and cover tape 20. The carrier tape 132 has a pair of opposed elongate lip portions 134, and one or more pockets 136. Components 138, such as electronic components, can be placed in the pockets 136. After the components 138 have been placed in the pockets 136 of carrier tape 132, as desired, cover tape 20 can be adhered to elongate lip portions 134 in order to cover the pockets 136 and contain the components 138 between the carrier tape 132 and the cover tape 20. The cover tape 20 can be dispensed from a roll.

In order to expose and remove the components 138, a portion of the cover tape 20 is separated from the system 130. As shown in FIG. 6, the central portion 40 of the cover tape 20, defined between tear enabling features 32 and 34 (tear enabling features 31 and 33 not shown), is torn away. Outer portions 140 of cover tape 20 remain adhered to carrier tape 132 after the central portion 40 of the cover tape 20 is torn away. After being torn away, the central portion 40 of the cover tape 20 can be wound into a roll 142 for discard or recycling.

The central portion 40 of the cover tape 20 is separated at the tear enabling features 31/32 and 33/34 (e.g., score lines in the embodiments shown and described with respect to FIGS. 1-2). In other embodiments, separation can occur at material interfaces (e.g., material interfaces 108 as shown and described with respect to FIG. 4), at bands of weaker material (e.g., bands 110 and 112 of the second material 106 as shown and described with respect to FIG. 5), or other locations depending on the type and location of tear enabling features.

Figure 7:
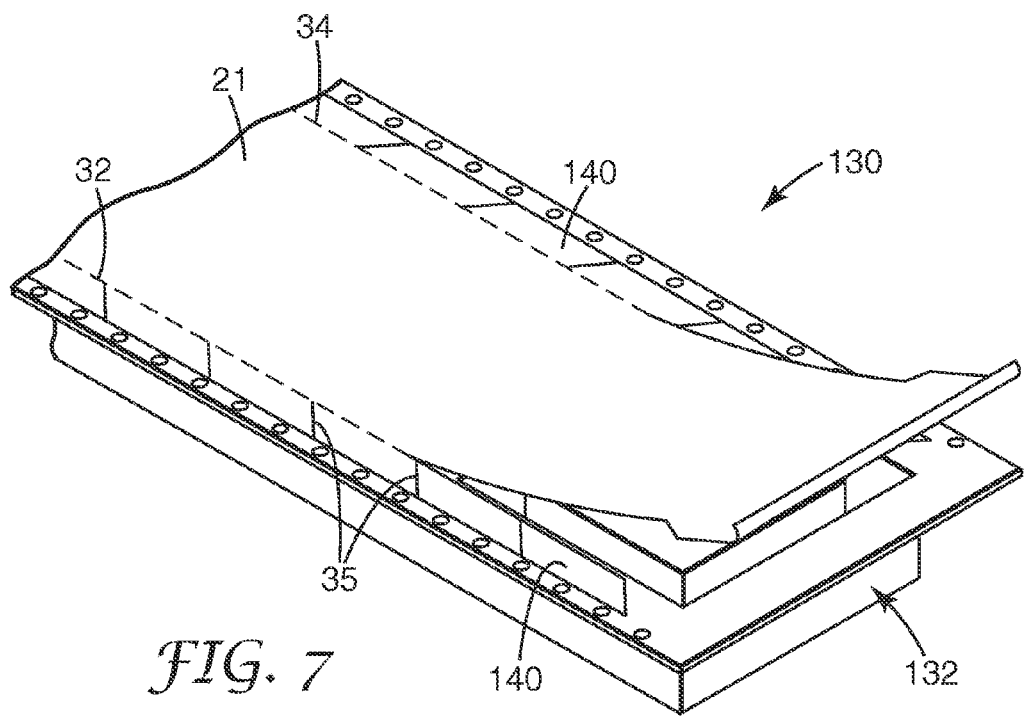
FIG. 7 is a perspective view of a carrier tape/cover tape system according to the present invention, showing separation of the cover tape therefrom.

FIG. 7 is a perspective view of a further embodiment of a carrier tape/cover tape system 130 that includes a carrier tape 132 and cover tape 21. The cover tape 21 is generally similar to cover tape 20; however, in addition to tear enabling features 31/32 and 33/34 the film 22 includes directional tear features 35 in the outer portions 140 to initiate a tear along each of the tear enabling feature sets 31/32 and 33/34 when the cover tape is first removed from carrier tape 132. The directional tear features 35 may be, for example, nicks, slits, scores, or perforations spaced apart from each other in outer portions 140 of the cover tape 21. In another embodiment, directional tear features 35 may be formed by providing a series of wedges or triangular cut-outs (not shown) along the peripheral edge of the outer portions 140. If wedges are provided, then the edges of the wedge may be less than or equal to 900. Directional tear features 35 may also be used with cover tape embodiments of the invention such as those illustrated in FIGS. 4 and 5.

The spacing between the directional tear features 35 may be random or intermittent or may be equidistant as shown in FIG. 7. Directional tear features 35 extend inward from the peripheral edges of the outer portions 140 towards the central portion 40 and are typically angled less than 90° with respect to the peripheral edge of the outer portions 140 in the direction of removal of the cover tape 21. Directional tear features need not be straight lines as illustrated in FIG. 7. They may be curved in part or in whole, e.g., they may be arcuate-shaped where "arcuate" refers to a curved shape of a directional tear feature in which a leading end (i.e., the edge of the directional tear feature that is located adjacent to the edge of the cover tape) is oriented in a different direction than a trailing end of the directional tear feature (i.e., the edge of the tear initiating feature located adjacent to the tear enabling feature) such that one portion of the directional tear feature has a sharp curve and another portion has a flat curve. "Sharp" refers to a curve with a narrow, compacted apex and "flat" refers to a curve with a broad, extended apex. Alternate directional tear feature shapes may be used. Although the directional tear features 35 may be interspersed throughout the entire of the outer portions 140, a suitable spacing between the directional tear features 35 is about 4 mm (0.157 inches) to about 254 mm (10 inches).

When the cover tape 21 is initially peeled from the carrier tape 132, outer portions 140 may be pulled away from carrier tape 132 with central portion 40. As the cover tape 21 continues to be pulled the tear force or tension in the cover tape 21 is redirected at directional tear features 35 to the tear enabling features 31/32, 33/34 separating outer portions 140 from central portion 40, so that the outer portions 140 are no longer separated from the carrier tape 132. To assure a redirection of the tear forces, the length of each directional tear features 35 preferably extend from the peripheral edge of the outer portions 140 to the tear enabling features 31/32, 33/34. However, to prevent accidental tearing of central portion 40, the directional tear features 35 preferably do not extend into the central portion 40. For example, where the width of the cover tape 132 is 5.4 mm (0.213 inches) and the width of each outer portion 140 is 0.665 mm (0.02618 inches), the length of each directional tear features 35 is 0.66 mm (0.02598 inches) at an angle of 45 degrees. Of course, as the width of the cover tape 132 increases the width of the outer portions 140 and directional tear features 35 may increase.

It is desirable to have a substantially uniform tear force when tearing away a portion of the cover tape. Although lasers or blades can be used to create scoring lines, making multiple precise scoring lines capable of less than 0.001 inch (0.0254 mm) in variation can be expensive with lasers, and is nearly impossible with known uses of blades that are hindered by variations in blade cutting edge alignment.

In order to achieve uniform tearing with cover tapes having scoring lines, it is desired to provide scoring lines with very little variation in depth along the length of the cover tape as well as between distinct scoring lines. Scoring lines with substantially uniform depth can be simply and efficiently formed in a film web using the method and apparatus described in co-pending U.S. patent application Ser. No. 11/228,956, which is incorporated by reference.

In light of the discussion above, numerous advantages and benefits of the present invention should be recognized. One advantage of the cover tape according to the present invention is that it has a very uniform removal force of the central portion of the tape, which reduces the risk of miss-picks during storage and transportation operation due to parts or components "jumping" out of the carrier pocket of the carrier tape.

Although the present invention has been described with reference to several alternative embodiments, workers skilled in the art will recognize that changes may be made in form and detail without departing from the spirit and scope of the invention. For instance, various types of tear enabling features can be used according to the present invention, and those tear enabling features can have various arrangements.

The invention claimed is:

1. An article comprising:
a cover tape comprising:
a base film layer having opposed longitudinal edges and upper and lower surfaces;
adhesive stripes adjacent to the longitudinal edges; and
tear enabling features extending from each of the upper and lower surfaces and part-way through the center of the base film layer, the tear enabling features being substantially parallel to the longitudinal edges and interior to the adhesive stripes.

2. The article of claim 1 further comprising vertically recessed areas in the base film layer extending along the longitudinal edges wherein the adhesive is on the recessed areas.

3. The article of claim 2, wherein the adhesive has a width equal to or less than a width of the recessed areas.

4. The article of claim 2, wherein the adhesive in each recessed area is spaced from the longitudinal edge of the base film layer.

5. The article of claim 2, wherein the adhesive in each recess is spaced from an adjacent tear enabling feature.

6. The article of claim 1, wherein the base film layer is composed of a material selected from the group consisting of polyethylene terephthalate, polypropylene, polyamides, polyvinyl chloride, polystyrene, polycarbonate, polyethylene, polyacrylonitrile, polyolefin and polyimide.

7. The article of claim 1, wherein the adhesive is selected from the group consisting of pressure sensitive, heat activated and microencapsulated adhesives.

8. The article of claim 1 wherein the tear enabling features at the upper surface are interior to the tear enabling features at the lower surface.

9. The article of claim 1 wherein the tear enabling features at the upper surface are longer than to the tear enabling features at the lower surface.

10. The article of claim 1 wherein the tear enabling features at the upper surface extend beyond the tear enabling features at the lower surface in the interior of the base film layer.

11. The article of claim 1, wherein each tear enabling feature is continuous in the longitudinal direction.

12. The article of claim 1, wherein the tear enabling features provide a consistent tear force.

13. The article of claim 1, wherein the cover tape further comprises tear initiating features extending from the longitudinal edge toward at least one tear enabling feature at an angle of less than or equal to 90° relative to a tear enabling feature.

14. The article of claim 1 further comprising:
a carrier tape having compartments formed therein for holding components,
wherein the cover tape is adhered to the carrier tape for sealing components in the compartments.

* * * * *

UNITED STATES PATENT AND TRADEMARK OFFICE
CERTIFICATE OF CORRECTION

PATENT NO. : 8,247,057 B2  
APPLICATION NO. : 11/463569  
DATED : August 21, 2012  
INVENTOR(S) : Ruben Velasquez Urey Page 1 of 1

It is certified that error appears in the above-identified patent and that said Letters Patent is hereby corrected as shown below:

Cover Page
Under "Foreign Patent Documents", please add -- JP 11-165364 06/1999 --.

Column 6
Line 30, delete "900." and insert in place thereof -- 90° --.

Signed and Sealed this

Thirteenth Day of November, 2012

David J. Kappos
*Director of the United States Patent and Trademark Office*